(12) United States Patent
Kohli

(10) Patent No.: US 8,217,426 B2
(45) Date of Patent: Jul. 10, 2012

(54) BIPOLAR TRANSISTORS WITH RESISTORS

(75) Inventor: Puneet Kohli, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 100 days.

(21) Appl. No.: 12/731,667

(22) Filed: Mar. 25, 2010

(65) Prior Publication Data

US 2010/0178740 A1 Jul. 15, 2010

Related U.S. Application Data

(62) Division of application No. 11/874,730, filed on Oct. 18, 2007, now abandoned.

(51) Int. Cl.
*H01L 21/8238* (2006.01)
(52) U.S. Cl. .................................. 257/202; 148/DIG. 9
(58) Field of Classification Search .................. 438/202; 148/DIG. 9
See application file for complete search history.

(56) References Cited

U.S. PATENT DOCUMENTS

| | | | |
|---|---|---|---|
| 5,112,761 A | | 5/1992 | Matthews |
| 5,407,841 A | * | 4/1995 | Liao et al. ..................... 438/202 |
| 5,416,039 A | | 5/1995 | Yilmaz et al. |
| 2005/0070102 A1 | | 3/2005 | Coolbaugh et al. |
| 2006/0145300 A1 | | 7/2006 | Coolbaugh et al. |

* cited by examiner

*Primary Examiner* — N Drew Richards
*Assistant Examiner* — Steven Rao
(74) *Attorney, Agent, or Firm* — John J. Patti; Wade J. Brady, III; Frederick J. Telecky, Jr.

(57) ABSTRACT

Complementary MOS (CMOS) integrated circuits include MOS transistors, resistors and bipolar transistors formed on a common substrate. An emitter region of a bipolar transistor is implanted with a first dopant in an implantation process that implants source/drain regions of an MOS transistor, and is also implanted with a second dopant of same conductivity type in another implantation process that implants a body region of a resistor. The first and second dopants may optionally be the same dopant. The source/drain regions are implanted with the resistor body region covered by a first patterned mask; and the resistor body region is implanted with the MOS transistor source/drain regions covered by a second patterned mask. The implantations of the MOS transistor source/drain regions and of the resistor body region the source/drain regions can occur in any order, with the emitter region implanted during both implantations.

17 Claims, 9 Drawing Sheets

BIPOLAR TRANSISTORS WITH RESISTORS

This is a division of U.S. application Ser. No. 11/874,730, filed Oct. 18, 2007, the entirety of which is incorporated herein by reference.

BACKGROUND

This invention relates to the field of integrated circuits. More particularly, this invention relates to bipolar transistors in integrated circuits.

Integrated circuits commonly include n-channel MOS (NMOS) transistors, p-channel MOS (PMOS) transistors, bipolar pnp transistors, bipolar npn transistors, diodes and resistors, in and on a semiconductor substrate. Doped regions in and on the semiconductor substrate that are parts of the transistors, diodes and resistors are typically formed by ion implantation or diffusion of dopant species into the substrate. In order to achieve more economical manufacturing, photolithographic, ion implantation and diffusion processes that are used to form MOS transistors are typically applied to regions containing bipolar transistors and diodes, thus eliminating the costs associated with separate, dedicated photolithographic, ion implantation and diffusion process operations for bipolar transistors and diodes. Dedicated process operations for a component are process operations that only affect regions containing that component. Components such as bipolar transistors and diodes that are formed without dedicated process operations are commonly known as parasitic components. For example, emitter regions of vertical bipolar pnp transistors are commonly implanted in the same operation as p-channel MOS transistor source and drain regions. Using ion implantation and diffusion operations from MOS transistors for forming bipolar transistors and diodes has a disadvantage of not optimizing performance parameters of the affected bipolar transistors and diodes, because process parameters for the ion implantation and diffusion operations are chosen to maximize selected parameters of the relevant MOS transistors. For example, parasitic vertical bipolar pnp transistors commonly have gains below 2, while vertical bipolar pnp transistors formed using dedicated processes commonly have gains above 10.

Resistors are typically formed using dedicated ion implantation and diffusion operations in order to achieve desired ranges of sheet resistivities.

SUMMARY

Complementary MOS integrated circuits (CMOS ICs) often include resistors and bipolar transistors formed on a common substrate.

In one aspect, the invention provides a method of forming a bipolar transistor in which an emitter region is implanted with a first dopant of given conductivity type in an implantation process that implants source/drain regions of an MOS transistor, and is also implanted with a second dopant of the same given conductivity type in another implantation process that implants a body region of a resistor. In another aspect, the invention provides an integrated circuit formed by the method.

In described embodiments, the MOS transistor source/drain regions are implanted with the resistor body region covered by a first patterned mask to prevent implantation of the resistor body region; and the resistor body region is implanted with the MOS transistor source/drain regions covered by a second patterned mask to prevent implantation of the MOS transistor source/drain regions. The implanting of the MOS transistor source/drain regions and the implanting of the resistor body region the source/drain regions may be conducted in any order. The second dopant used for simultaneous implantation of the resistor body region and the emitter region may be the same dopant as the second dopant used for simultaneous implantation of the source/drain regions and the emitter region.

DETAILED DESCRIPTION OF EXAMPLE EMBODIMENTS

Example embodiments of the invention are described below with reference to the attached drawings. The invention is not limited by the illustrated ordering of acts or events, as some acts may occur in different orders and/or concurrently with other acts or events.

For the purposes of this disclosure, the term "type polarity" or "type conductivity" of a dopant refers to the polarity or conductivity of carrier, n-type or p-type, generated by the dopant in a semiconductor. For example, phosphorus and arsenic both generate n-type carriers in silicon, so both are considered to be of the same type polarity or conductivity.

Figure 1A:
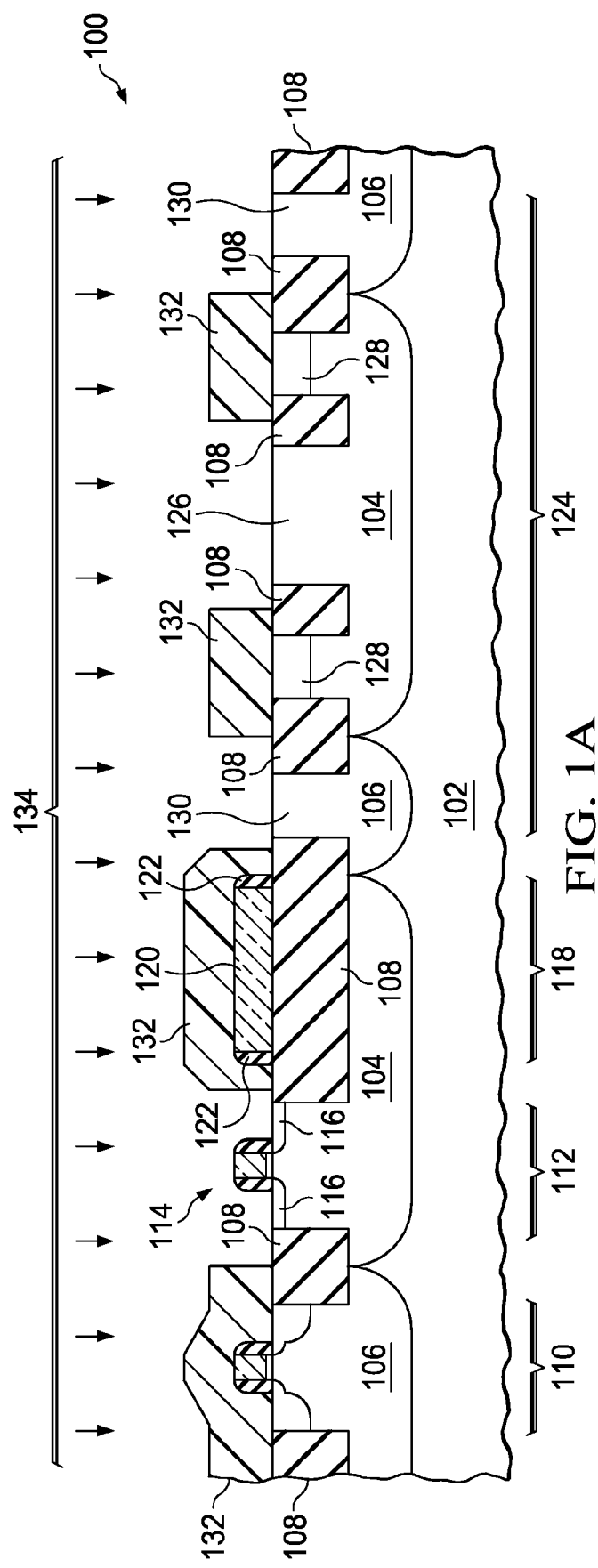
FIGS. 1A-1C are cross-sectional views of an integrated circuit including an NMOS and a PMOS transistor, a p-type polysilicon resistor, and a vertical pnp bipolar transistor formed in accordance with principles of the invention.
Figure 1B:
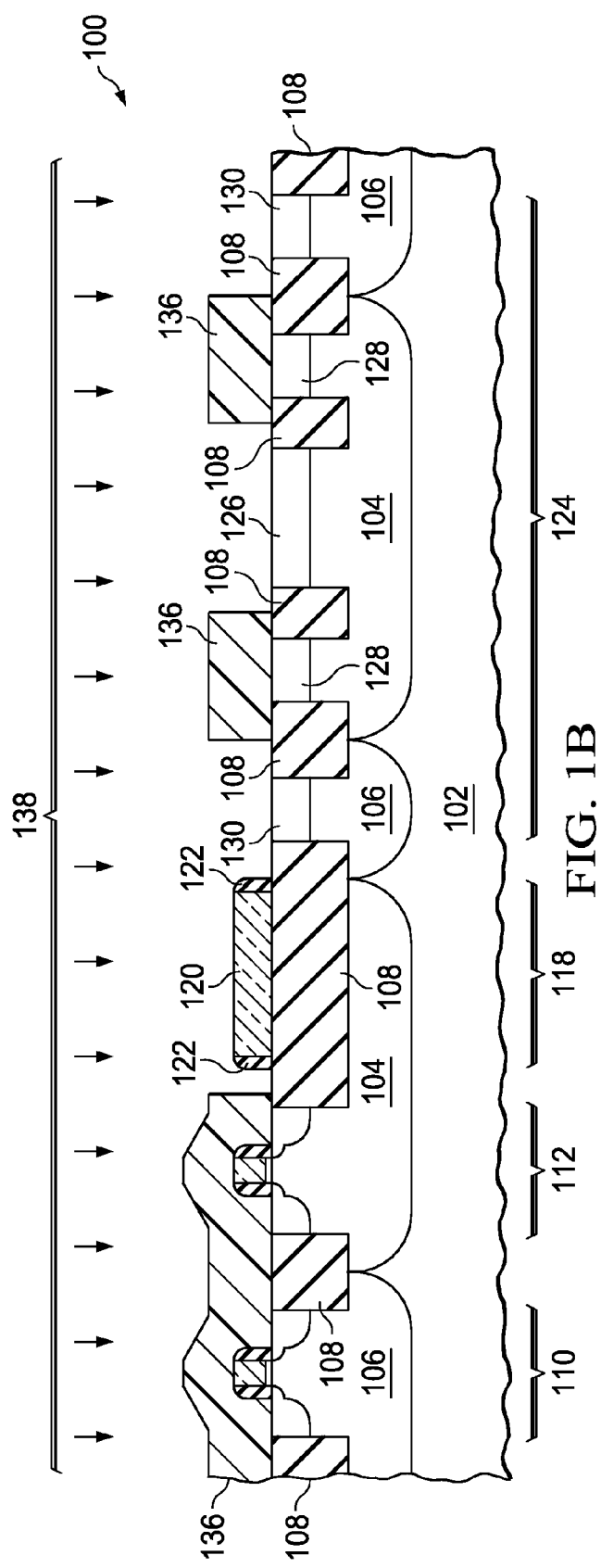
Figure 1C:
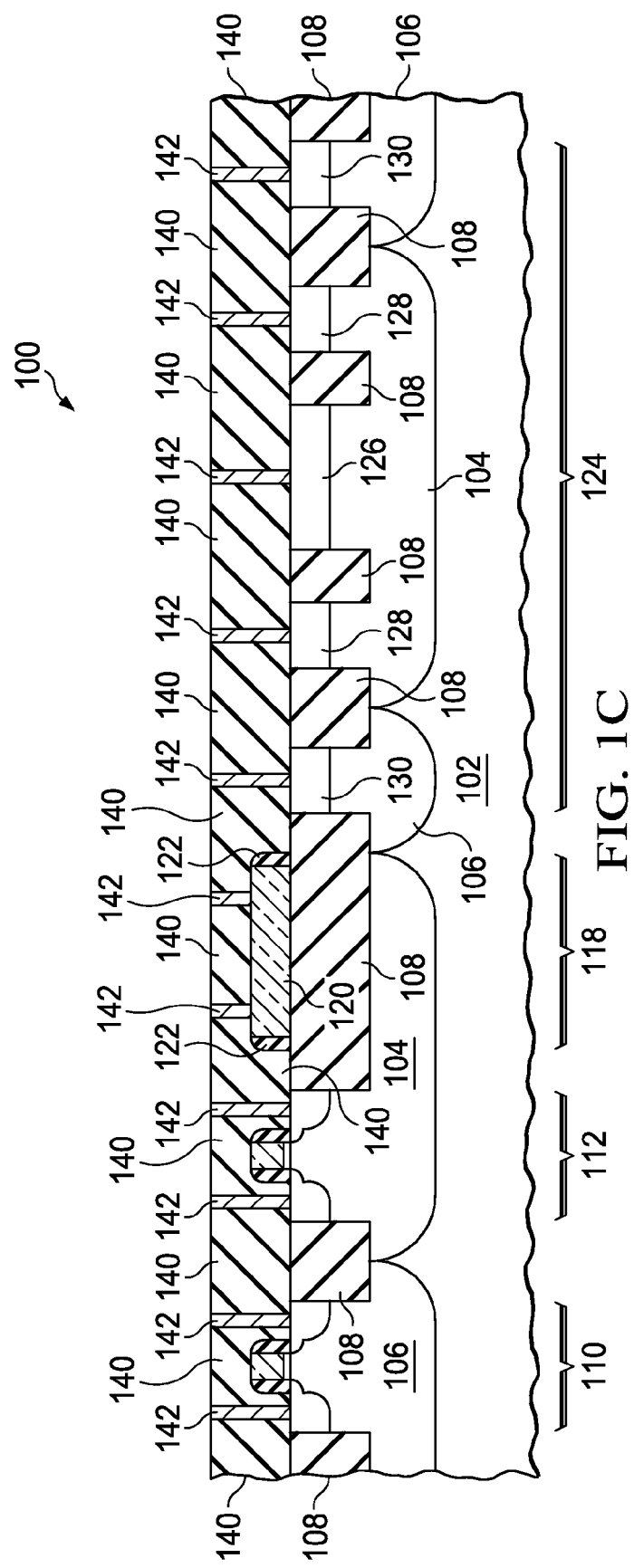

FIGS. 1A-1C show an integrated circuit including an NMOS and a PMOS transistor, a p-type polysilicon resistor, and a vertical pnp bipolar transistor. FIG. 1A depicts the integrated circuit during ion implantation of PMOS source and drain regions. FIG. 1B depicts the integrated circuit during ion implantation of the p-type polysilicon resistor. FIG. 1C depicts the integrated circuit after transistor and resistor fabrication are completed.

Referring to FIG. 1A, integrated circuit (100) includes a p-type substrate (102), n-type regions known as n-wells (104), p-type regions known as p-wells (106), and field oxide regions (108), typically formed of silicon dioxide by local oxidation of silicon (LOCOS) or shallow trench isolation (STI), separating components. An NMOS transistor (110) is formed in a p-well (106). A PMOS transistor (112) is depicted as partially formed in an n-well (104). Elements of the partially formed PMOS transistor include PMOS gate structure (114) and p-type source/drain extensions (116). A p-type polysilicon resistor (118) is depicted as partially formed on field oxide (108), and includes polysilicon resistor body (120) and gate sidewall spacer material (122), typically formed of silicon nitride, abutting the resistor body (120). A vertical bipolar pnp transistor (124) is depicted as partially formed. Emitter region (126) and base diffused regions (128) are located in an n-well (104). Collector regions (130) are located in p-wells (106). A first photoresist layer (132) has been deposited and patterned on a top surface of the integrated circuit (100) to allow a first p-type dopant (134), typically boron or gallium, or a combination of both, to be ion implanted, in doses ranging from $10^{14}$ to $10^{16}$ cm$^{-2}$, at energies ranging from 1 keV to 300 keV, into the PMOS transistor (112) and the emitter region (126) and the collector regions (130) of vertical bipolar pnp transistor (124). A primary purpose of implanting the first p-type dopant (134) is to form source and drain regions for the PMOS transistor.

Referring to FIG. 1B, a second photoresist layer (136) has been deposited and patterned on a top surface of the integrated circuit (100) to allow a second p-type dopant (138), also typically boron or gallium, or a combination of both, to be ion implanted, in doses ranging from $10^{14}$ to $10^{16}$ cm$^{-2}$, at energies ranging from 1 keV to 300 keV, into the p-type polysilicon resistor (118) and emitter region (126) and collector regions (130) of vertical bipolar pnp transistor (124). A primary purpose of implanting the second p-type dopant (138) is to attain a desired sheet resistance in the polysilicon resistor body (120). The implant energy of the second p-type dopant (138) may be adjusted to improve the vertical bipolar pnp transistor (124) without adversely affecting the polysilicon resistor (118).

Implanting the emitter region (126) with both PMOS source/drain implant and polysilicon resistor body implant, according to an embodiment of the instant invention, is advantageous because the emitter-base junction is formed closer to the base-collector junction than it would be in the case of a single emitter implant, which increases gain of the vertical bipolar pnp transistor. It will be recognized by workers in integrated circuit fabrication that the benefits of the embodiments discussed above will be realized if the relative order of the PMOS source/drain implant and polysilicon resistor body implant are reversed.

Referring to FIG. 1C, fabrication of the components in the IC (100) is continued with deposition of a pre-metal dielectric (PMD) layer stack (140), typically including a liner layer, usually silicon nitride, and a PMD layer, usually silicon dioxide. Contacts (142), typically tungsten, are formed in the PMD layer stack (140) to connect NMOS transistor (110), PMOS transistor (112), polysilicon resistor (118) and vertical bipolar pnp transistor (124) to form electrical circuits.

In an alternate embodiment of the instant invention, an emitter region of a vertical bipolar pnp transistor may be implanted with only the p-type polysilicon resistor implant, thus providing a second version of vertical bipolar pnp transistor that may be used in circuits.

It will be recognized by workers in integrated circuit fabrication that the embodiments discussed above will be beneficial if the vertical bipolar pnp transistor is utilized as a diode in a circuit, by providing a lower leakage current in reverse bias.

Figure 2A:
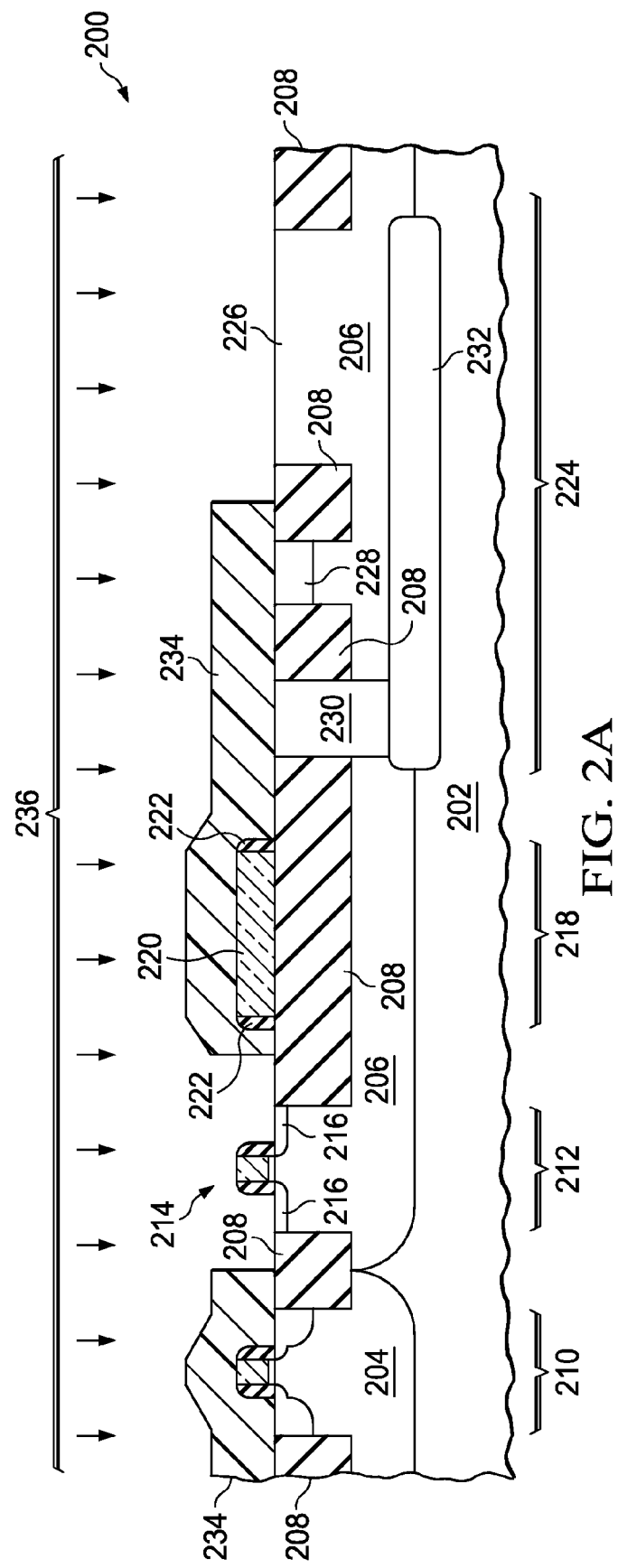
FIGS. 2A-2C are cross-sectional views of an integrated circuit including an NMOS and a PMOS transistor, an n-type polysilicon resistor, and a buried collector npn bipolar transistor formed in accordance with principles of the invention.
Figure 2B:
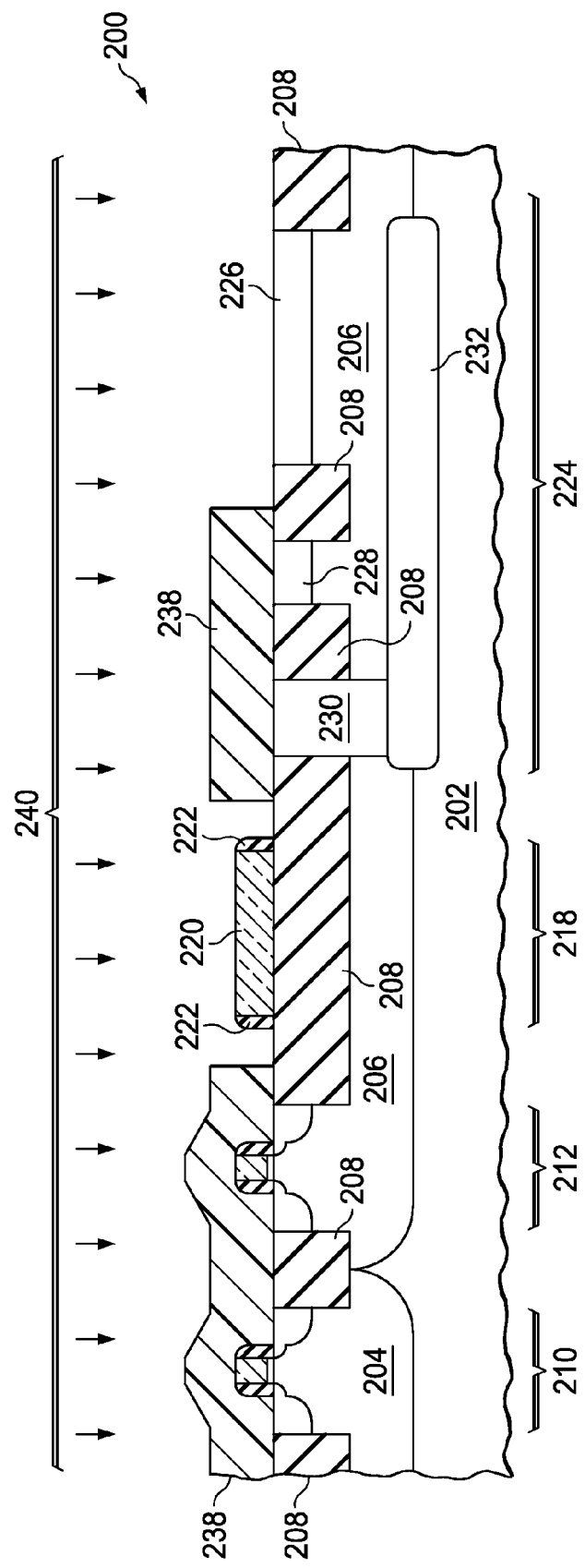
Figure 2C:
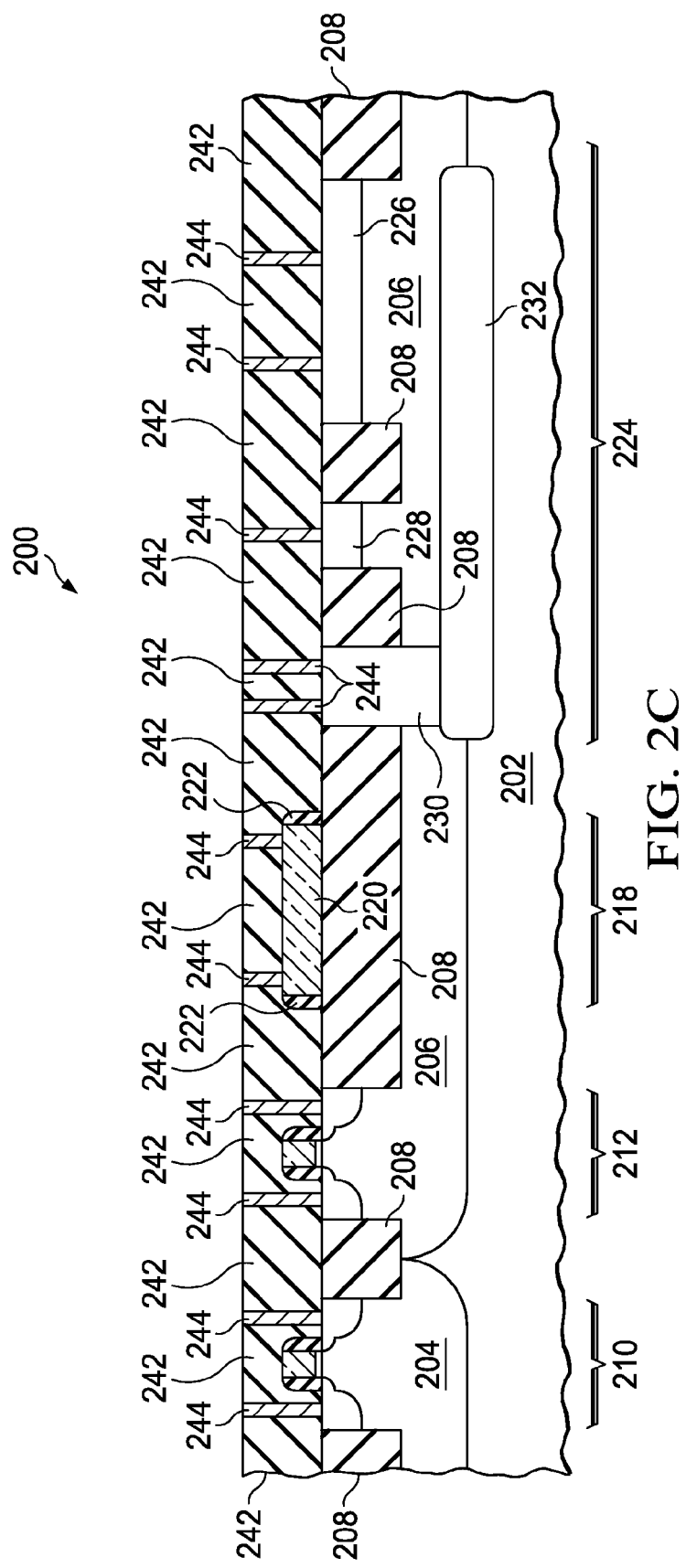

FIGS. 2A-2C show an integrated circuit including an NMOS and a PMOS transistor, an n-type polysilicon resistor, and a buried collector npn bipolar transistor. FIG. 2A depicts the integrated circuit during ion implantation of NMOS source and drain regions. FIG. 2B depicts the integrated circuit during ion implantation of the n-type polysilicon resistor. FIG. 2C depicts the integrated circuit after transistor and resistor fabrication are completed.

Referring to FIG. 2A, integrated circuit (200) includes a p-type substrate (202), n-well (204), p-well (206), and field oxide regions (208), typically formed of silicon dioxide by local oxidation of silicon (LOCOS) or shallow trench isolation (STI), separating components. A PMOS transistor (210) is formed in an n-well (204). An NMOS transistor (212) is depicted as partially formed in a p-well (206). Elements of the partially formed NMOS transistor include NMOS gate structure (214) and n-type source/drain extensions (216). An n-type polysilicon resistor (218) is depicted as partially formed on field oxide (208), and includes polysilicon resistor body (220) and gate sidewall spacer material (222), typically formed of silicon nitride, abutting the resistor body (220). A buried collector bipolar npn transistor (224) is depicted as partially formed. Emitter region (226) and base diffused region (228) are located in a p-well (206). Collector diffused region (230) connects to n-type buried collector layer (232). A first photoresist layer (234) has been deposited and patterned on a top surface of the integrated circuit (200) to allow a first n-type dopant (236), typically phosphorus, arsenic or antimony, or a combination of these three, to be ion implanted, in doses ranging from $10^{14}$ to $10^{16}$ cm$^{-2}$, at energies ranging from 1 keV to 500 keV, into the NMOS transistor (212) and the emitter region (226) of buried collector bipolar npn transistor (224). A primary purpose of implanting the first n-type dopant (236) is to form source and drain regions for the NMOS transistor.

Referring to FIG. 2B, a second photoresist layer (238) has been deposited and patterned on a top surface of the integrated circuit (200) to allow a second n-type dopant (240), also typically phosphorus, arsenic or antimony, or a combination of these three, to be ion implanted, in doses ranging from $10^{14}$ to $10^{16}$ cm$^{-2}$, at energies ranging from 1 keV to 500 keV, into the n-type polysilicon resistor (218) and emitter region (226) of buried collector bipolar npn transistor (224). A primary purpose of implanting the second n-type dopant (240) is to attain a desired sheet resistance in the polysilicon resistor body (220). The implant energy of the second n-type dopant (240) may be adjusted to improve the buried collector bipolar npn transistor (224) without adversely affecting the polysilicon resistor (218).

Implanting the emitter region (226) with both NMOS source/drain implant and polysilicon resistor body implant, according to an embodiment of the instant invention, is advantageous because the emitter-base junction is formed closer to the base-collector junction than it would be in the case of a single emitter implant, which increases gain of the buried collector bipolar npn transistor. It will be recognized by workers in integrated circuit fabrication that the benefits of the embodiments discussed above will be realized if the relative order of the NMOS source/drain implant and polysilicon resistor body implant are reversed.

Referring to FIG. 2C, fabrication of the components in the IC (200) is continued with deposition of a pre-metal dielectric (PMD) layer stack (242), typically including a liner layer, usually silicon nitride, and a PMD layer, usually silicon dioxide. Contacts (244), typically tungsten, are formed in the PMD layer stack (242) to connect NMOS transistor (210), PMOS transistor (212), polysilicon resistor (218) and buried collector bipolar npn transistor (224) to form electrical circuits.

In an alternate embodiment of the instant invention, an emitter region of buried collector bipolar npn may be implanted with only the n-type polysilicon resistor implant, thus providing a second version of buried collector bipolar npn transistor that may be used in circuits.

Figure 3A:
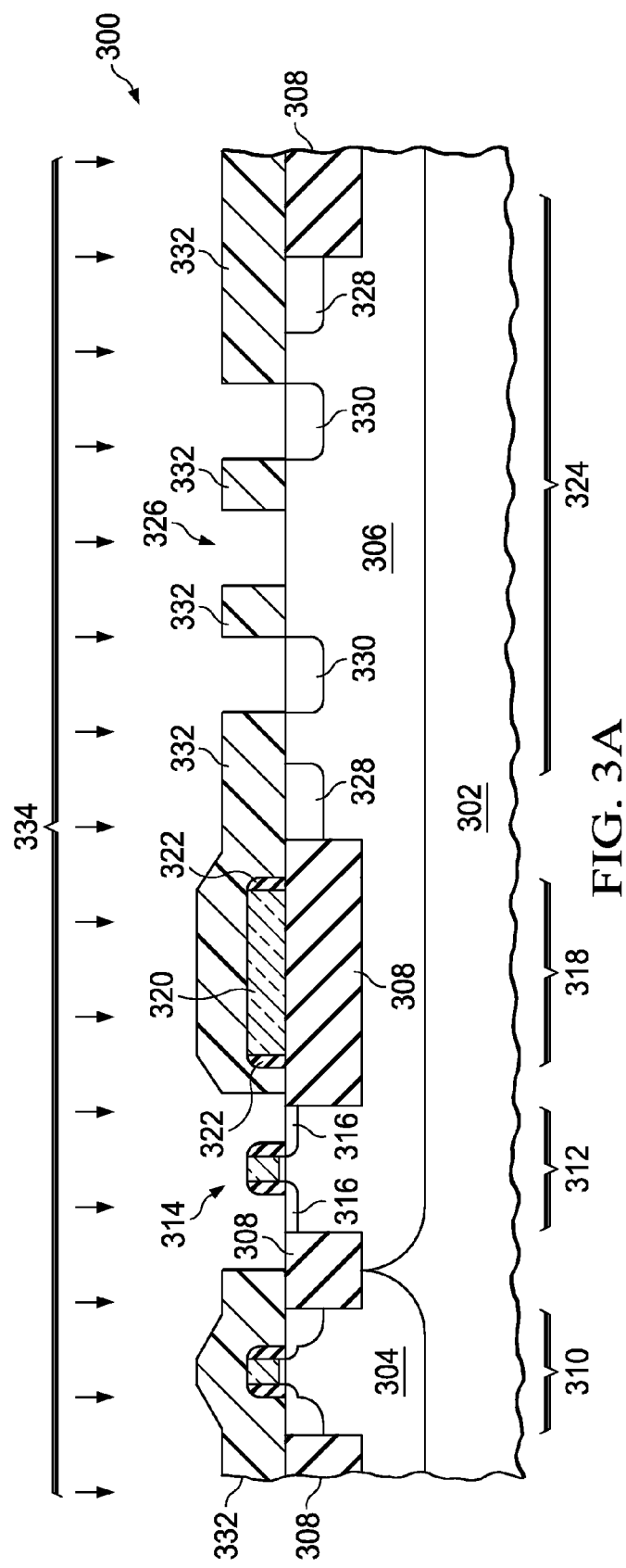
FIGS. 3A-3C are cross-sectional views of an integrated circuit including an NMOS and a PMOS transistor, an n-type polysilicon resistor, and a lateral npn bipolar transistor formed in accordance with principles of the invention.
Figure 3B:
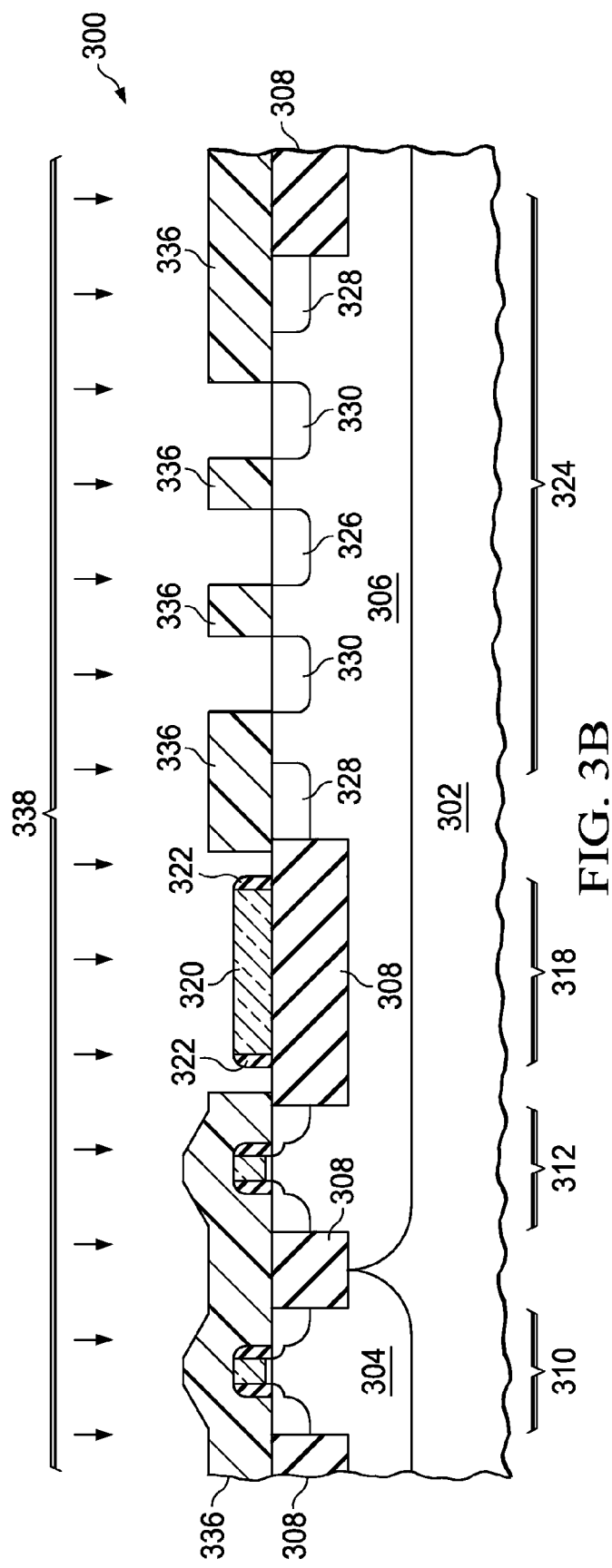
Figure 3C:
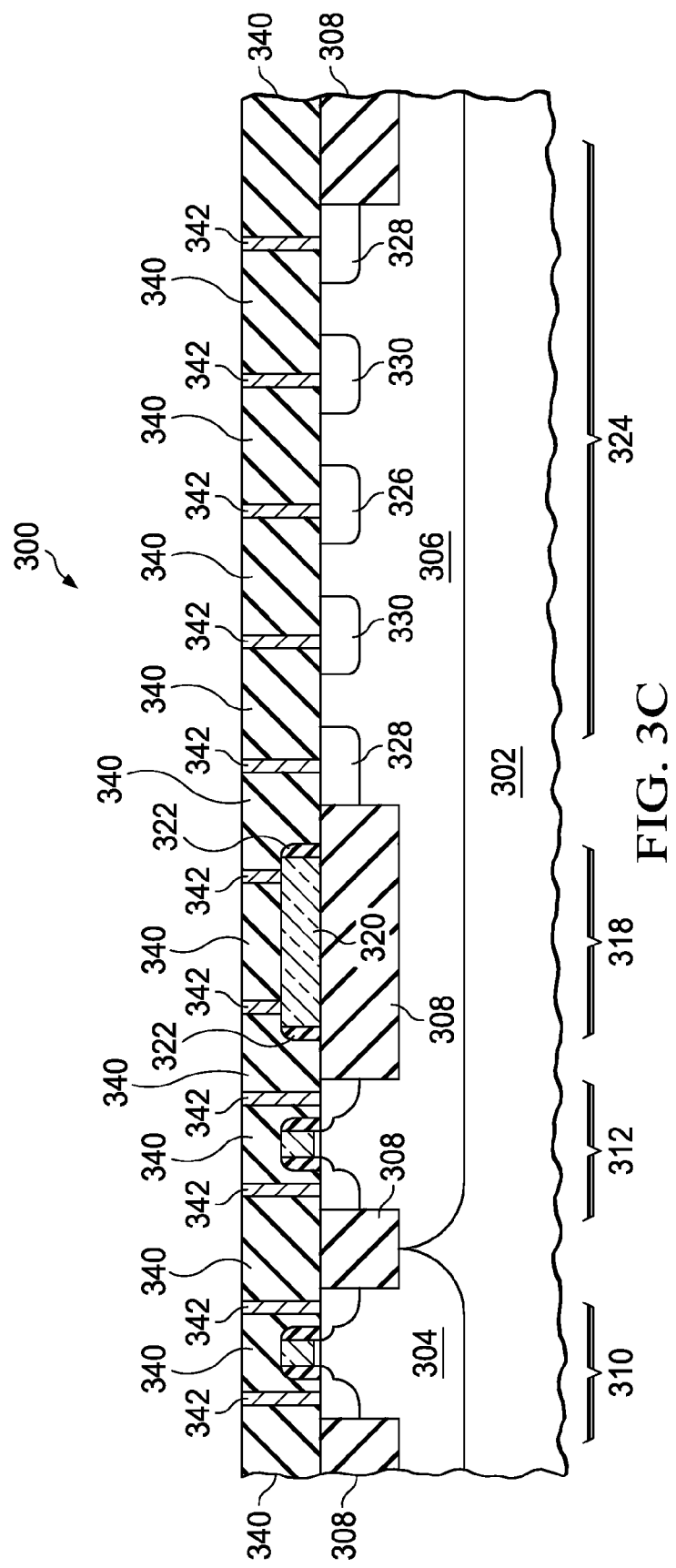

FIGS. 3A-3C show an integrated circuit including an NMOS and a PMOS transistor, an n-type polysilicon resistor, and a lateral npn bipolar transistor. FIG. 3A depicts the integrated circuit during ion implantation of NMOS source and drain regions. FIG. 3B depicts the integrated circuit during ion implantation of the n-type polysilicon resistor. FIG. 3C depicts the integrated circuit after transistor and resistor fabrication are completed.

Referring to FIG. 3A, integrated circuit (300) includes a p-type substrate (302), n-well (304), p-well (306), and field oxide regions (308), typically formed of silicon dioxide by local oxidation of silicon (LOCOS) or shallow trench isolation (STI), separating components. A PMOS transistor (310) is formed in an n-well (304). An NMOS transistor (312) is depicted as partially formed in a p-well (306). Elements of the partially formed NMOS transistor include NMOS gate structure (314) and n-type source/drain extensions (316). An n-type polysilicon resistor (318) is depicted as partially formed on field oxide (308), and includes polysilicon resistor body (320) and gate sidewall spacer material (322), typically formed of silicon nitride, abutting the resistor body (320). A lateral bipolar npn transistor (324) is depicted as partially formed. Emitter region (326), base diffused region (328) and collector diffused region (330) are located in a p-well (306). A first photoresist layer (332) has been deposited and patterned on a top surface of the integrated circuit (300) to allow a first n-type dopant (334), typically phosphorus, arsenic or antimony, or a combination of these three, to be ion implanted, in doses ranging from $10^{14}$ to $10^{16}$ cm$^{-2}$, at energies ranging from 1 keV to 500 keV, into NMOS transistor (310) and emitter region (326) of lateral bipolar npn transistor (324). A primary purpose of implanting the first n-type dopant (334) is to form source and drain regions for the NMOS transistor.

Referring to FIG. 3B, a second photoresist layer (336) has been deposited and patterned on a top surface of the integrated circuit (300) to allow a second n-type dopant (338), also typically phosphorus, arsenic or antimony, or a combination of these three, to be ion implanted, in doses ranging from $10^{14}$ to $10^{16}$ cm$^{-2}$, at energies ranging from 1 keV to 500 keV, into the n-type polysilicon resistor (318) and emitter region (326) of lateral bipolar npn transistor (324). A primary purpose of implanting the second n-type dopant (338) is to attain a desired sheet resistance in the polysilicon resistor body (320). The implant energy of the second n-type dopant (338) may be adjusted to improve the lateral bipolar npn transistor (324) without adversely affecting the polysilicon resistor (318).

Implanting the emitter region (326) with both NMOS source/drain implant and polysilicon resistor body implant, according to an embodiment of the instant invention, is advantageous because the emitter-base junction is formed closer to the base-collector junction than it would be in the case of a single emitter implant, which increases gain of the lateral bipolar npn transistor. It will be recognized by workers in integrated circuit fabrication that the benefits of the embodiments discussed above will be realized if the relative order of the NMOS source/drain implant and polysilicon resistor body implant are reversed.

Referring to FIG. 3C, fabrication of the components in the IC (300) is continued with deposition of a pre-metal dielectric (PMD) layer stack (340), typically including a liner layer, usually silicon nitride, and a PMD layer, usually silicon dioxide. Contacts (342), typically tungsten, are formed in the PMD layer stack (340) to connect NMOS transistor (310), PMOS transistor (312), polysilicon resistor (318) and lateral bipolar npn transistor (324) to form electrical circuits.

In an alternate embodiment of the instant invention, an emitter region of lateral bipolar npn may be implanted with only the n-type polysilicon resistor implant, thus providing a second version of lateral bipolar npn transistor that may be used in circuits.

In another embodiment of the instant invention, a lateral pnp bipolar transistor, a PMOS transistor and a p-type polysilicon resistor may be fabricated following the procedure discussed in reference to FIGS. 3A through 3C, with appropriate changes in device polarities and dopant types. Implanting an emitter region of a lateral pnp bipolar transistor with both PMOS source/drain implant and polysilicon resistor body implant, is advantageous because the emitter-base junction is formed closer to the base-collector junction than it would be in the case of a single emitter implant, which increases gain of the lateral bipolar pnp transistor.

It will be recognized by workers in integrated circuit fabrication that the embodiments of the instant invention discussed above may be realized when resistors formed in active areas of the integrated circuit are substituted for the polysilicon resistors described in the discussions.

What is claimed is:

1. A method of forming an integrated circuit comprising:
    forming a MOS transistor at a first region of a substrate, including implanting source and drain regions of the MOS transistor with a first dose of a first dopant;
    forming a resistor at a second region of the substrate, including implanting a body region of the resistor with a second dose of a second dopant, of the same type polarity as the first dopant, wherein the second dose implant occurs separately from the first dose implant; and
    forming a bipolar transistor at a third region of the substrate, including implanting an emitter region with the first dose of the first dopant simultaneously with the implanting of the source and drain regions of the MOS transistor, and implanting the emitter region with the second dose of the second dopant simultaneously with the implanting of the body region of the resistor.

2. The method of claim 1, wherein the body region of the resistor comprises polycrystalline silicon.

3. The method of claim 1, wherein the body region of the resistor comprises an active region in the substrate.

4. The method of claim 1, wherein the MOS transistor is a p-channel MOS transistor, and wherein the first dopant is a p-type dopant, and wherein the second dopant is a p-type dopant, and wherein the bipolar transistor is a vertical pnp bipolar transistor.

5. The method of claim 1, wherein the MOS transistor is an n-channel MOS transistor, and wherein the first dopant is an n-type dopant, and wherein the second dopant is an n-type dopant, and wherein the bipolar transistor is a buried collector npn bipolar transistor.

6. The method of claim 1, wherein the MOS transistor is an n-channel MOS transistor, and wherein the first dopant is an n-type dopant, and wherein the second dopant is an n-type dopant, and wherein the bipolar transistor is a lateral npn bipolar transistor.

7. The method of claim 1, wherein the MOS transistor is a p-channel MOS transistor, and wherein the first dopant is a p-type dopant, and wherein the second dopant is a p-type dopant, and wherein the bipolar transistor is a lateral pnp bipolar transistor.

8. A method of forming an integrated circuit comprising:
    forming a MOS transistor on a substrate, comprising forming source and drain regions by implanting with a first dose of a dopant of a given polarity;
    forming a resistor on the substrate, comprising forming a body region by implanting with a second dose of the dopant, wherein the second dose implant occurs separately from the first dose implant; and
    forming a bipolar transistor on the substrate, comprising forming an emitter region by implanting with a third dose of the dopant; the third dose comprising the first dose of the dopant implanted simultaneously with the implant of the source and drain regions, and the second dose of the given type dopant implanted simultaneously with the implant of the body region.

9. The method of claim 8, wherein the MOS transistor is a p-channel MOS transistor, and wherein the dopant is a p-type dopant, and wherein the bipolar transistor is a pnp bipolar transistor.

10. The method of claim 9, wherein the MOS transistor is an n-channel MOS transistor, and wherein the dopant is an n-type dopant, and wherein the bipolar transistor is an npn bipolar transistor.

11. A method of forming an integrated circuit on a semiconductor substrate including a MOS transistor with source/drain regions, a resistor with a body region, and a bipolar transistor with an emitter region, the method comprising:
    forming a first patterned mask over the substrate;
    in a first implant, implanting a first dopant into the emitter region and into one of the source/drain regions or the body region, with the other of the source/drain regions or the polysilicon body region covered against the first implant by the first patterned mask;
    forming a second patterned mask over the substrate; and
    in a second implant, implanting a second dopant of the same type polarity as the first dopant into the emitter region and into the other of the source/drain regions or the body region, with the one of the source/drain regions or the polysilicon body region covered against the second implant by the second patterned mask.

12. The method of claim 11, wherein the process of forming a resistor further comprises the step of forming the body region of polycrystalline silicon.

13. The method of claim 11, wherein the process of forming a resistor further comprises the step of forming the body region in an active region of the substrate.

14. The method of claim 11, wherein the MOS transistor is a p-channel MOS transistor, and wherein the first dopant is a p-type dopant, and wherein the second dopant is a p-type dopant, and wherein the bipolar transistor is a vertical pnp bipolar transistor.

15. The method of claim 11, wherein the MOS transistor is an n-channel MOS transistor, and wherein the first dopant is an n-type dopant, and wherein the second dopant is an n-type dopant, and wherein the bipolar transistor is a buried collector npn bipolar transistor.

16. The method of claim 11, wherein the MOS transistor is an n-channel MOS transistor, and wherein the first dopant is an n-type dopant, and wherein the second dopant is an n-type dopant, and wherein the bipolar transistor is a lateral npn bipolar transistor.

17. The method of claim 11, wherein the MOS transistor is a p-channel MOS transistor, and wherein the first dopant is a p-type dopant, and wherein the second dopant is a p-type dopant, and wherein the bipolar transistor is a lateral pnp bipolar transistor.

* * * * *